United States Patent [19]

Allensworth et al.

[11] Patent Number: 4,524,295

[45] Date of Patent: Jun. 18, 1985

[54] APPARATUS AND METHOD FOR GENERATING MECHANICAL WAVES

[75] Inventors: Dwight L. Allensworth; Peter J. Chen, both of Albuquerque, N. Mex.

[73] Assignee: The United States of America as represented by the United States Department of Energy, Washington, D.C.

[21] Appl. No.: 436,557

[22] Filed: Oct. 25, 1982

[51] Int. Cl.[3] .......... H01L 41/08

[52] U.S. Cl. .......... 310/328; 310/345; 310/348; 331/158

[58] Field of Search .......... 310/311, 317, 334, 354-356, 310/322, 329, 359, 328, 345, 348; 367/155, 157, 162, 165, 158; 331/158

[56] References Cited

U.S. PATENT DOCUMENTS

| | | | |
|---|---|---|---|
| 2,488,781 | 11/1949 | Reeves | 310/356 |
| 3,268,855 | 8/1966 | Hagey | 310/334 |
| 3,376,438 | 4/1968 | Colbert | 367/157 |
| 3,804,329 | 4/1974 | Martner | 310/322 |
| 4,302,826 | 11/1981 | Kent et al. | 367/162 |
| 4,373,143 | 2/1983 | Lindberg | 310/334 |
| 4,442,372 | 4/1984 | Roberts | 310/321 |

*Primary Examiner*—Peter S. Wong
*Assistant Examiner*—D. L. Rebsch
*Attorney, Agent, or Firm*—James H. Chafin; Albert Sopp; Judson R. Hightower

[57] ABSTRACT

Mechanical waves are generated in a medium by subjecting an electromechanical element to an alternating electric field having a frequency which induces mechanical resonance therein and is below any electrical resonance frequency thereof.

9 Claims, 1 Drawing Figure

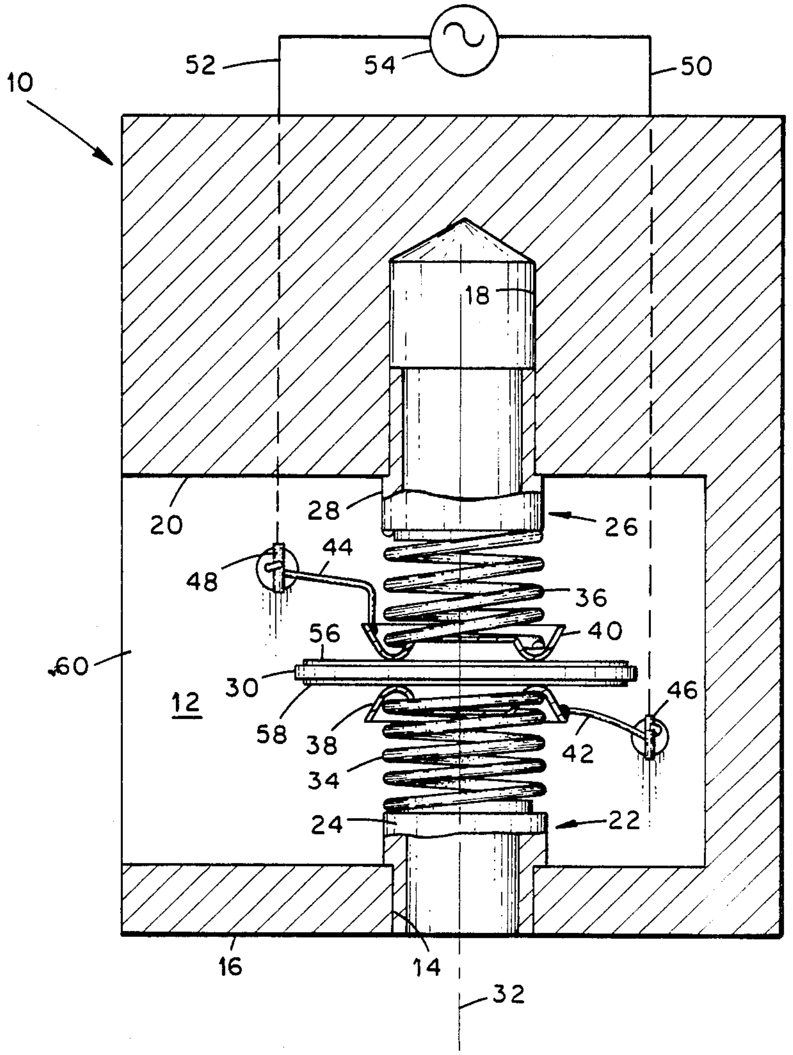
10
52
54
50
18
20
28
26
48
44
36
40
56
60
30
46
12
58
38
42
34
24
22
16
14
32

APPARATUS AND METHOD FOR GENERATING MECHANICAL WAVES

This invention, which resulted from a contract with the United States Department of Energy, relates to the generation of mechanical waves for certain applications such as sound transducers and sonars and, more particularly, to a more efficient way of operating electromechanical elements used in wave generators.

BACKGROUND OF THE INVENTION

It is common knowledge that when a specimen of a piezoelectric material is driven by a cyclic electric field, "resonances" at particular frequencies can occur depending on the geometry of the specimen and its material properties. Because of the existence of "resonances", resonator measurements have been extensively employed in the determination of the elastic, piezoelectric and dielectric properties of these materials, including, of course, poled ferroelectric materials. The conventional method of discerning the onset of "resonances" is to monitor admittance (or impedance), which becomes large (or small) at such instances. The divergence of admittance is equivalent to the divergence of the time rate of change of the electric displacement, so that these resonances may be viewed as electrical resonances. It is generally believed that the mechanical responses of the specimen also diverge during such instances, so that mechanical resonances are said to occur simultaneously with electrical resonances. This belief has been the basis of much theoretical and experimental work for many years.

Heretofore, electromechanical elements of sound transducers and sonars have been operated at electrical resonant frequencies, which results in the generation of a large amount of heat and degrades the performance of such systems. Operation of sound transducers and sonars at lower electrical resonant frequencies by having larger electromechanical elements would increase the range of the waves generated because of less attenuation but the problem of heat generation still exists.

SUMMARY OF THE INVENTION

It is therefore a primary objective of this invention to improve the performance of electromechanical elements used in sound transducers, sonar apparatus and the like.

This objective is achieved by a preferred embodiment of the invention comprising a disk-shaped electromechanical element having: a metallic coating on each of its faces; a pair of springs respectively abutting trough-shaped washers to resiliently support said disk; and means connected to said washers for applying to them, and thus to said disk, an alternating electric field having a frequency which induces mechanical resonance in the disk and is below any electrical resonant frequency thereof.

DESCRIPTION OF THE DRAWING

The accompanying drawing illustrates, in cross section, components of a preferred embodiment of the invention and schematically represents a means for applying an alternating electrical field to an electromechanical element included therein.

DETAILED DESCRIPTION OF THE PREFERRED EMBODIMENT OF THE INVENTION

In the drawing, reference number 10 generally designates a housing having a cavity 12 and an opening 60 therein, the cavity 12 communicating with space outside the housing through an aperture 14 formed in a side wall 16 and the opening 60 of the housing 10. A hole 18 is formed in the thick wall 20 of housing 10 in coaxial relation with aperture 14. Generally designated by reference number 22 is a first tubular insert, one end of which is secured in aperture 14, and the other end of which projects into cavity 12. An integral shoulder 24 circumscribes insert 22 and extends from a point near its free end to wall 16. Likewise, one end of a second tubular insert, generally designated by reference number 26, is secured in hole 18, and a shoulder 28 on this insert extends from a point near its free end to wall 20. A disk 30 formed of an electromechanical material is resiliently held between inserts 22,26 and centered on their common longitudinal axis 32 by (1) a pair of helical springs 34,36 each having one end engaged with a respective one of said inserts, and (2) a pair of annular, trough-shaped washers 38,40 which respectively engage the other ends of said springs. Wires 42,44 respectively connect washers 38,40 with electrical terminals 46,48 mounted on housing 10, and these terminals are in turn connected by leads 50,52 to an AC source 54.

Disk 30 is made of a ferroelectric material supplied by Gulton Industries under the designation PZT 65/35. In the described embodiment of the invention, disk 30 has a diameter of $2.184\times10^{-2}$ m and a thickness of $7.620\times10^{-4}$ m. Its faces are coated with fired silver paint of thickness $2.540\times10^{-5}$ m to within $7.620\times10^{-4}$ m of its outer edge, these coatings being shown with exaggerated thickness in the drawing and respectively designated therein by reference numbers 56,58.

OPERATION OF THE PREFERRED EMBODIMENT OF THE INVENTION

In a conventional sound transducer utilizing an electromechanical disk as a means for vibrating a medium, the device consisting of the disk and its support structure is driven at one of its resonant frequencies, which frequencies depend upon the geometry and material of which the disk and support structure are constructed as well as the bonding technique employed in attaching the disk to its support structure. Integrity of the bond which attaches the electromechanical element is critical for proper operation. The above-described wavegenerating apparatus and the method of operating the same are based on the discovery by the named inventors that electromechanical elements exhibit mechanical resonant frequencies which are lower than the electrical resonant frequencies of the elements and which are not associated with detectable changes in admittance as in the case of the electrical resonant frequencies. Utilization of these lower resonant frequencies in the operation of the electromechanical elements of sound transducers and sonar equipment provides advantages not heretofore attainable, including low heat generation and increase in range of the waves generated. Transducer and sonar assemblies smaller than those which are now used can also be designed if the newly discovered mechanical resonant frequencies of piezoelectric and ferroelectric materials are utilized.

Disk 30 of the sound transducer assembly which has been described and illustrated by way of example is resiliently supported between inserts 22,26 by compressed springs 34,36, and therefore the disk can be readily changed to another disk with different diameter and thickness. The AC source 54 is operated to impress an electric field in the element 30 via the silver coatings 56,58 at a frequency below the lowest electrical resonant frequency of the PZT 65/35 ferroelectric element. For a reason which will become manifest hereinafter, AC source 54 is preferably operated at a frequency of about 10.4 kHz for the particular PZT 65/35 disk 30. The contractions and expansions of disk 30 obviously generate waves in the medium which is contacted with the disk through aperture 14 and opening 60.

A displacement laser interferometer system was used by the named inventors to measure the mechanical displacements of specimens of piezoelectric and ferroelectric materials driven by cyclic electric fields. The results were quite surprising and contrary to conventional assumptions concerning the properties of electromechanical materials. First, it was found that mechanical resonances of quite large amplitudes can exist independent of any noticeable electrical disturbances. These resonances occur at frequencies which are much lower than those at which the lowest detectable electrical resonances occur; they are also detected at intermediate frequencies between electrical resonances. Secondly, mechanical resonances, but no electrical resonances, are also detected in virgin (i.e., unpoled) and depoled specimens of ferroelectric ceramics, and these resonances also occur when the specimens are subsequently poled.

The implications of the preceding results are immense. First, it is not sufficient to detect the onset of "resonances" by monitoring admittance (or impedance) alone. It is necessary to distinguish between electrical resonances and mechanical resonances even though both of these phenomena are consequences of the same stimulus. Secondly, much of the theoretical literature associated with this subject is open to question because it is based on the notion that electrical and mechanical resonances occur simultaneously, and for ferroelectric ceramics only in the case of the poled specimens. Presumably, virgin ferroelectric ceramics cannot be excited by cyclic electric fields. This concerns not only the constitutive relations but also the boundary initial value problems corresponding to the conditions of the specimens being excited.

A number of specimens of various materials and geometries were examined in the inventors' study. These included X-cut quartz, Z-cut $LiNbO_3$, slim loop ferroelectrics, PZT 65/35 and PLZT 7/65/35 ferroelectric materials supplied by Motorola, $BaTiO_3$ ceramic, Clevite's PZT 8 ceramic, and Channel 5500 ceramic.

For the sake of brevity, only the test results obtained with PZT 65/35 specimens will be reported in detail hereinafter even though the mechanical resonant phenomenon which is described has been detected in all of the above-mentioned materials.

Two specimens of PZT 65/35 (hereafter referred to as PZT 65/35-S1 and PZT 65/35-S2) were taken from the same piece of hot-pressed PZT 65/35 prepared at the laboratories of Sandia Corporation in Albuquerque, N. Mex. They were identical cylindrical disks with diameters of $3.607\times10^{-2}$ and thicknesses of $8.128\times10^{-4}$ m. Central circular regions of the faces of the disks, with a diameter $1.793\times10^{-2}$ m, were electroded with vapor deposited aluminum of thickness $3.1\times10^{-7}$ m (3100 Å). A third specimen (PZT 65/35-G) of PZT 65/35 consisting of a cylindrical disk with diameter $2.184\times10^{-2}$ m and thickness $7.620\times10^{-4}$ m was prepared by Gulton Industries. The diameter of the electroded area of its faces was $2.032\times10^{-2}$ m, and the electrodes were fired on silver with thickness of $2.540\times10^{-5}$ m.

In order to attain essentially stress-free conditions the specimens were symmetrically supported on three ball bearings equally spaced at $1.270\times10^{-2}$ m. The specimens were held in contact with the ball bearings by three small springs directly over the locations of the ball bearings and exerting a total force of less than $6.675\times10^{-2}$N on each specimen. The signal beam of an interferometer was directed at the centers of the top faces of the disks, on which were glued very small spectral mirrors. This permitted the determination of the axial mechanical displacements of the disk faces. The electric displacements were determined in the usual manner by measuring the charge on an integrating capacitor connected in series with the specimens.

The essential data were collected by means of Lissajous oscilloscope displays of interference fringe intensity versus driving voltage and charge versus driving voltage. These displays not only gave the amplitudes of the various quantities but also exhibited the phase relationships between fringe intensity and driving voltage and between charge and driving voltage. Phase relationships are essential in discerning the onset of "resonances". It is helpful, though not necessary, to limit the amplitude of the driving voltage so that the total change of the interference fringe intensity is less than that of half an interference fringe. The resolution of the mechanical displacement measurements was such that each centimeter-division on the oscilloscope screen was equivalent to approximately $5\times10^{-10}$ m (5Å) depending on the intensity of half an interference fringe. The test results for the identical specimens PZT 65/35-S1 and PZT 65/35-S2 are given in Table I below.

TABLE I

Mechanical Resonant Frequencies of PZT 65/35-S1 and PZT 65/35-S2

| 1<br>PZT 65/35-S1<br>Virgin | 2<br>PZT 65/35-S2<br>Virgin | 3<br>PZT 65/35-S1<br>Thermally<br>Annealed | 4<br>PZT 65/<br>35-S2<br>Poled |
|---|---|---|---|
| | | | 1.437 kHz |
| 2.153 kHz | 2.115 kHz | 2.138 kHz | 2.222 kHz |
| | | | 2.630 kHz[3] |
| 5.469 kHz | 5.439 kHz | 5.365 kHz | 5.458 kHz |
| | 5.994 kHz[2] | 5.960 kHz[2] | |
| 6.130 kHz | 6.063 kHz[2] | 6.020 kHz[2] | 6.134 kHz[4] |
| 17.607 kHz | 17.654 kHz | 17.507 kHz | 17.871 kHz[2] |
| | | | 18.265 kHz[2] |
| | | | 27.799 kHz |
| 40.283 kHz | 40.366 kHz | 39.943 kHz | 40.823 kHz |
| 69.066 kHz[1] | 69.347 kHz[1] | 68.574 kHz | 69.789 kHz |
| | | | 71.550 kHz[5] |
| | | | E72.042 kHz[6] |

Maximum frequency of driving voltage: 102 kHz.
Amplitude of driving voltage: 5V RMS.
[1]Mechanical resonances barely detectable.
[2]Fringe intensity and driving voltage achieve quadrature successively without achieving 180° phase shift between these frequencies.
[3]Mechanical resonance consists of the fundamental and the second harmonic.
[4]Fringe intensity and driving voltage achieve quadrature but not 180° phase shift.
[5]Mechanical resonance precedes accompanying electrical resonance.
[6]Lowest detectable electrical resonance, prefixed by letter E.

In columns 1 and 2 are listed the mechanical resonant frequencies exhibited by the specimens in the virgin state. No electrical resonance was observed up to a driving voltage frequency of 102 kHz. The agreement of the resonant frequencies between the two specimens was quite good, thereby ensuring that the specimens were as nearly identical as possible and that the measurement techniques were fairly repeatable. The mechanical resonant frequencies of sample PZT 65/35-S1 after thermal annealing at 400° C. for 25 minutes are listed in column 3 of Table I. Notice that these frequencies are similar to those exhibited by the specimen in the virgin state. However, the mechanical displacements are quite different, a matter which will be alluded to later. Listed in column 4 are the resonant frequencies which were exhibited by specimen PZT 65/35-S2 after it was poled axially via the application of a linearly increasing voltage having a maximum amplitude of 1.68 kV at 25s. It now had four additional mechanical resonances and an electrical resonance up to a driving voltage frequency of 102 kHz. At 2.630 kHz the mechanical resonance consists of the fundamental and the second harmonic. In a subsequent measurement, mechanical resonances at 148.839 kHz, 187.492 kHz, and 194.138 kHz, and an electrical resonance at 189.561 kHz were also detected.

Temperature fluctuations and residues of cleaning fluids would have affected not only the resonant frequencies but also the mechanical displacements of the specimens as determined by laser interferometry. Accordingly, the specimens were usually allowed to stabilize for at least 12 hours after being placed in their test configurations, and the entire system including the laser interferometer was maintained at a constant temperature of 25.6° C. within an enclosure. This procedure ensured that the results obtained were as repeatable as possible. The mechanical displacements, and to a much lesser degree the resonant frequencies, may also be affected by the spacings of the support ball bearings. The reason for this is quite obvious; the measured mechanical displacements depend on the vibrational patterns whose manifestations in turn depend on the support conditions. Nevertheless, it is meaningful and useful to compare results for the same support conditions.

In Table II are listed the peak mechanical displacements corresponding to the mechanical resonances exhibited by the specimen PZT 65/35-S1 in the virgin and thermally annealed states.

TABLE II

Mechanical Resonant Frequencies and Peak Mechanical Displacements of PZT 65/35-S1

| PZT 65/35-S1, Virgin | | PZT 65/35-S1, Thermally Annealed | |
|---|---|---|---|
| Resonant Frequencies | Peak Mechanical Displacement | Resonant Frequencies | Peak Mechanical Displacement |
| 2.153 kHz | $6.6 \times 10^{-10}$ m | 2.138 kHz | $2.55 \times 10^{-9}$ m |
| 5.469 kHz | $4.82 \times 10^{-9}$ m | 5.365 kHz | $1.72 \times 10^{-8}$ m |
| | | 5.960 kHz[2] | $7.53 \times 10^{-9}$ m |
| 6.130 kHz | $2.71 \times 10^{-9}$ m | 6.020 kHz[2] | $5.95 \times 10^{-9}$ m |
| 17.607 kHz | $6.35 \times 10^{-9}$ m | 17.507 kHz | $1.08 \times 10^{-8}$ m |
| 40.283 kHz | $6.7 \times 10^{-10}$ m | 39.943 kHz | $3.14 \times 10^{-9}$ m |
| 69.066 kHz[1] | — | 68.574 kHz | $1.29 \times 10^{-9}$ m |

Maximum frequency of driving voltage: 102 kHz.
Amplitude of driving voltage: 5V RMS.
[1]Mechanical resonance barely detectable.
[2]Fringe intensity and driving voltage achieve quadrature successively without achieving 180° phase shift between these frequencies.

Notice that there is generally a substantial increase in the peak mechanical displacements from the virgin state to the thermally annealed state. Results for the specimen PZT 65/35-S2 are listed in Table III.

TABLE III

Mechanical Resonant Frequencies and Peak Mechanical Displacements of PZT 65/35-S2

| PZT 65/35-S2, Virgin | | PZT 65/35-S2, Poled | |
|---|---|---|---|
| Resonant Frequencies | Peak Mechanical Displacement | Resonant Frequencies | Peak Mechanical Displacement |
| | | 1.437 kHz | $5.4 \times 10^{-10}$ m |
| 2.115 kHz | $4.0 \times 10^{-10}$ m | 2.222 kHz | $3.60 \times 10^{-9}$ m |
| | | 2.630 kHz[3] | |
| 5.439 kHz | $2.62 \times 10^{-9}$ m | 5.458 kHz | $8.86 \times 10^{-9}$ m |
| 5.994 kHz[1] | $1.34 \times 10^{-9}$ m | | |
| 6.063 kHz[1] | $4.4 \times 10^{-10}$ m | 6.134 kHz[4] | $9.6 \times 10^{-10}$ m |
| 17.654 kHz | $5.11 \times 10^{-9}$ m | 17.871 kHz[1] | $5.4 \times 10^{-9}$ m |
| | | 18.265 kHz[1] | $1.2 \times 10^{-10}$ m |
| | | 27.799 kHz | $7.8 \times 10^{-10}$ m |
| 40.366 kHz | $9.2 \times 10^{-10}$ m | 40.823 kHz | $1.39 \times 10^{-9}$ m |
| 69.347 kHz[2] | — | 69.789 kHz | $1.46 \times 10^{-8}$ m |
| | | 71.550 kHz[5] | $1.60 \times 10^{-9}$ m |
| | | E72.042 kHz[6] | |

Maximum frequency of driving voltage: 102 kHz.
Amplitude of driving voltage: 5V RMS.
[1]Fringe intensity and driving voltage achieve quadrature successively without achieving 180° phase shift between these frequencies.
[2]Mechanical resonance barely detectable.
[3]Mechanical resonance consists of the fundamental and the second harmonic.
[4]Fringe intensity and driving voltage achieve quadrature but not 180° phase shift.
[5]Mechanical resonance precedes accompanying electrical resonance.
[6]Lowest detectable electrical resonance, prefixed by letter E.

Again, there is generally shown a substantial increase in the peak mechanical displacements from the virgin state to the poled state. It should be noted that the peak mechanical displacements of the two specimens in the virgin state during resonances are comparable and of the same order of magnitude.

The mechanical resonant frequencies below that of the lowest detectable electrical resonance, together with the corresponding peak mechanical displacements of specimen PZT 65/35-G, are listed in Table IV.

TABLE IV

Mechanical Resonant Frequencies and Peak Mechanical Displacements of PZT 65/35-G
PZT 65/35-G, Poled

| Resonant Frequencies | Peak Mechanical Displacement |
|---|---|
| 2.764 kHz | $2.47 \times 10^{-9}$ m |
| 2.896 kHz | $1.80 \times 10^{-9}$ m |
| 10.375 kHz | $1.45 \times 10^{-8}$ m |
| 25.702 kHz | $1.10 \times 10^{-9}$ m |
| 41.063 kHz | $1.48 \times 10^{-9}$ m |
| 52.739 kHz | $5.7 \times 10^{-10}$ m |
| 95.219 kHz | $4.2 \times 10^{-10}$ m |
| E112.926 kHz[1] | |
| 113.062 kHz[2] | $9.8 \times 10^{-10}$ m |

Amplitude of driving voltage: 2V RMS.
[1]Lowest detectable electrical resonance, prefixed by letter E.
[2]Mechanical resonance follows accompanying electrical resonance.

As in the previous cases, there is a considerable number of purely mechanical resonances for poled PZT 65/35-G. Amplitudes of vibration of the specimens at resonances below electrical resonances can be quite large. Notice, in particular, the displacement at 69.789 kHz of specimen PZT 65/35-S2, poled, and that at 10.375 kHz of specimen PZT 65/35-G, poled.

It is clear that the results reported above are contrary to conventional understanding. Considerable effort was expended to ensure that the observations were indeed valid. For instance, the inventors used widely different specimen mounting techniques, substituted test instruments made by various manufacturers, and as a check tested specimens of carbon, plexiglass and fused quartz, which latter specimens did not exhibit, as expected, any resonance with the same test equipment. In addition, several of the mechanical resonant frequencies of the electromechanical elements were clearly audible to bystanders with normal hearing. The question of acoustic coupling to various components of the apparatus was also thoroughly investigated and found to be non-existent.

The inventors believe that the existence of purely mechanical resonances in ferroelectric ceramics may be due to the coupling of the driving voltage to the domains. The only essential difference between specimen PZT 65/35-S1 in the virgin state and the thermally annealed state is its domain structure. The results of Table II indicate that while the resonant frequencies are essentially the same, the peak mechanical displacements can be quite different. Specimen PZT 65/35-S1 was never poled; therefore, there is no substantive reason to suspect other causes. The dependence on domain structure may also be the reason that the peak mechanical displacements of specimens PZT 65/35-S1 and PZT 65/35-S2 in the virgin state were somewhat different.

Other interesting features associated with the existence of purely mechanical resonances were noted in the investigation, namely:

(i) for the same amplitude of the driving voltage there is no detectable heat generation during purely mechanical resonances, contrary to the situation during electrical resonances;

(ii) the peak mechanical displacements increase with increasing amplitude of the driving voltage over a considerable range;

(iii) the frequency of any particular resonance decreases with increasing amplitude of the driving voltage.

Since there is no detectable additional electrical power dissipated in heat generation during purely mechanical resonances, the power supply required to drive these resonances can be much smaller than that required to drive electrical resonances.

What is claimed is:

1. A method of inducing mechanical vibration in a medium comprising:

placing an electromechanical element in contact with said medium; and subjecting said electromechanical element to an alternating electric field at only a single frequency which excites mechanical resonance of only said element therein, said frequency being lower than any electrical resonant frequency of said element.

2. The method of claim 1 wherein said electromechanical element is formed of a ferroelectric material.

3. The method of claim 1 wherein said electromechanical element is a piezoelectrical crystal.

4. The method of claim 1 wherein said electromechanical element is formed of a material selected from the group consisting of quartz, lithium niobate, and barium titanate.

5. An apparatus for generating mechanical waves in a medium comprising:

a housing having a plurality of side walls and structure defining a cavity extending from one of said walls into said housing, said cavity being open to the medium surrounding said housing;

an electromechanical element resiliently mounted within said cavity in contact with the medium;

means for subjecting said electromechanical element to an alternating electric field at only a single frequency which excites a mechanical resonance if only said element therein, said frequency being lower than any electrical resonant frequency of said element.

6. The apparatus of claim 5 wherein said electromechanical element is formed of a ferroelectric material.

7. The apparatus of claim 5 wherein said electromechanical element is a piezoelectric crystal.

8. The apparatus of claim 5 wherein said electromechanical element is formed of a material selected from the group consisting of quartz, lithium niobate, and barium titanate.

9. The apparatus of claim 5 wherein said electromechanical element is a disk and including:

a metallic coating on each face of said disk;

a pair of annular trough-shaped washers respectively abutting the coatings on the faces of said disk;

a pair of springs respectively abutting said washers to resiliently support said disk; and means connected to said washers for applying said electric field to said disk.

* * * * *